(12) United States Patent
Wen (10) Patent No.: US 9,761,642 B2
(45) Date of Patent: Sep. 12, 2017

(54) TRANSFLECTIVE OLED DISPLAY

(71) Applicant: Microsoft Technology Licensing, LLC, Redmond, WA (US)

(72) Inventor: Chien-Hui Wen, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/720,070

(22) Filed: May 22, 2015

(65) Prior Publication Data

US 2016/0343782 A1 Nov. 24, 2016

(51) Int. Cl.
| | | |
|---|---|---|
| *G02F 1/1335* | (2006.01) | |
| *H01L 27/32* | (2006.01) | |
| *G02F 1/133* | (2006.01) | |
| *H01L 51/52* | (2006.01) | |
| *G02F 1/1333* | (2006.01) | |

(52) U.S. Cl.
CPC ...... *H01L 27/3232* (2013.01); *G02F 1/13306* (2013.01); *G02F 1/133514* (2013.01); *G02F 1/133553* (2013.01); *G02F 1/133555* (2013.01); *H01L 27/322* (2013.01); *H01L 27/3262* (2013.01); *H01L 51/524* (2013.01); *H01L 51/5271* (2013.01); *G02F 2001/133357* (2013.01); *G02F 2201/44* (2013.01)

(58) Field of Classification Search
CPC .............................................. G02F 1/133555
See application file for complete search history.

(56) References Cited

U.S. PATENT DOCUMENTS

| | | |
|---|---|---|
| 6,008,871 A | 12/1999 | Okumura |
| 6,893,781 B2 | 5/2005 | Nonaka et al. |
| 6,900,458 B2 | 5/2005 | Tung et al. |
| 7,745,986 B2 | 6/2010 | Ito et al. |
| 8,148,894 B2 | 4/2012 | Park et al. |

(Continued)

FOREIGN PATENT DOCUMENTS

CN 103207478 A 7/2013

OTHER PUBLICATIONS

Han-Ping D. Shieh, "Transflective Display by Hybrid OLED and LCD", In Proceedings of 18th Annual Meeting of the IEEE Lasers and Electro-Optics Society, Oct. 22, 2005, 2 pages.

(Continued)

*Primary Examiner* — Phu Vu
(74) *Attorney, Agent, or Firm* — Lempia Summerfiled Katz LLC (57) ABSTRACT

A display includes first and second substrates spaced apart from one another, an organic light emitting diode (OLED) structure supported by the first substrate, and a plurality of thin film structures supported by the first substrate, the plurality of thin film structures including a drive circuit element and a reflective element, the drive circuit element arranged in drive circuitry electrically coupled to the OLED structure, the drive circuitry configured to control the OLED structure. The display further includes an optical switch stack disposed between the second substrate and the plurality of thin film structures, the optical switch stack including a color filter positioned relative to the reflective element such that ambient light reflecting off of the reflective circuit element passes through the color filter.

23 Claims, 3 Drawing Sheets

(56) References Cited

U.S. PATENT DOCUMENTS

| | | |
|---|---|---|
| 8,593,598 B2 | 11/2013 | Chen et al. |
| 2003/0052869 A1 | 3/2003 | Fujii et al. |
| 2004/0178743 A1 | 9/2004 | Miller et al. |
| 2004/0179157 A1 | 9/2004 | Kim et al. |
| 2006/0125986 A1* | 6/2006 | Choo ................ G02F 1/133555 349/114 |
| 2006/0187392 A1* | 8/2006 | Okamoto .......... G02F 1/133555 349/114 |
| 2007/0153172 A1 | 7/2007 | Hsieh et al. |
| 2008/0174721 A1 | 7/2008 | Zhou |
| 2010/0171905 A1 | 7/2010 | Huang et al. |
| 2011/0128264 A1 | 6/2011 | Lee et al. |
| 2012/0127140 A1 | 5/2012 | Ryan et al. |
| 2013/0135547 A1 | 5/2013 | Hibayashi et al. |
| 2013/0215093 A1 | 8/2013 | Bergquist et al. |
| 2013/0235559 A1 | 9/2013 | Bergquist |
| 2013/0314634 A1 | 11/2013 | Koo et al. |

OTHER PUBLICATIONS

"International Search Report & Written Opinion Issued in PCT Application No. PCT/US2016/028196", Mailed Date: Jun. 23, 2016, 14 Pages.

"International Preliminary Report on Patentability Issued in PCT Application No. PCT/US2016/028196", dated Apr. 13, 2017, 7 Pages.

* cited by examiner

TRANSFLECTIVE OLED DISPLAY

DESCRIPTION OF THE DRAWING FIGURES

For a more complete understanding of the disclosure, reference is made to the following detailed description and accompanying drawing figures, in which like reference numerals may be used to identify like elements in the figures.

The embodiments of the disclosed devices may assume various forms. Specific embodiments are illustrated in the drawing (and are hereafter described) with the understanding that the disclosure is intended to be illustrative, and is not intended to limit the invention to the specific embodiments described and illustrated herein.

DETAILED DESCRIPTION

Displays consume power in accordance with image content. In OLED displays, only activated pixels consume power. OLED displays may thus present little power advantage when the image content is dark. In contrast, when the image content is bright, e.g., a web browser with a white background, power consumption may rise above other display technologies, such as liquid crystal displays. Power consumption may increase further when OLED displays generate white backgrounds and other content during bright ambient conditions, such as outdoor use.

Transflective OLED displays use both the emissions of the OLED pixels and reflected ambient light to present image content. In low light conditions, transflective OLED displays are operable in a transmissive mode in which the OLED pixels emit light to generate the image content. The transflective OLED displays are also operable in a reflective mode in which the ambient light is utilized to display content. The ambient light may be utilized instead of, and/or in addition to, the light emitted by the OLED pixels. As a result, transflective OLED displays consume less power in bright ambient conditions. The transflective OLED displays may thus be useful in connection with battery-powered devices and other contexts in which low power operation is beneficial.

In some cases, the ambient light is reflected off of a circuit element of circuitry configured to control OLED structures of the displays. The reflective circuit element may be a transistor electrode, interconnect, or other element of the OLED drive circuitry. Alternatively or additionally, thin film structures of the display used to form the drive circuitry also include reflective element positioned to reflect the ambient light. In such cases, the reflective element may be an electrically floating or other non-functional metal layer. In either case, the reflective element(s) may be composed of various reflective materials, including metals and/or semiconductors. The OLED drive circuitry and other thin film structures may be disposed in a transistor area of each sub-pixel of the display outside of a transmissive area of the sub-pixel. Elements disposed in the transistor area may thus provide useful contributions to display output rather than impose limits on the size of the transmissive area.

During operation in the transmissive mode, the OLED structures are activated. In the reflective mode, a liquid crystal layer or other optical switch layer may be used to generate the image content. For example, in some cases, each sub-pixel is filled with liquid crystal, across both the transmissive area and the transistor area. In other cases, the liquid crystal layer does not extend beyond the transistor area. The transistor area of each sub-pixel may include a transistor directed to controlling the OLED structure and a transistor directed to controlling the liquid crystal or other controllable layer.

Each sub-pixel of the transflective OLED displays includes a color filter positioned relative to the drive circuitry such that the reflected ambient light passes through the color filter. The composition, configuration, and other characteristics of the color filter may vary. In some cases, the color filter may be mixed or otherwise integrated with a liquid crystal layer. The color filter may be provided by a dye or other colored dopant incorporated into the liquid crystal layer. Alternatively, liquid crystal may be mixed with a color filter resin. Materials other than liquid crystal may be used to control (e.g., via a varying drive voltage) the intensity of the reflected light permitted to pass through the color filter.

Although described in connection with electronic devices having touchscreens, the transflective OLED displays may be used in connection with a wide variety of electronic devices, including those not having a touch-sensitive display. The size and form factor of the display and, thus, the electronic device may vary considerably. Devices may range from wearable or handheld devices, to laptop computers, and to televisions or other wall-mounted displays or other large-scale devices. The composition and other characteristics of the display and other components of the electronic device may vary accordingly.

Figure 1:
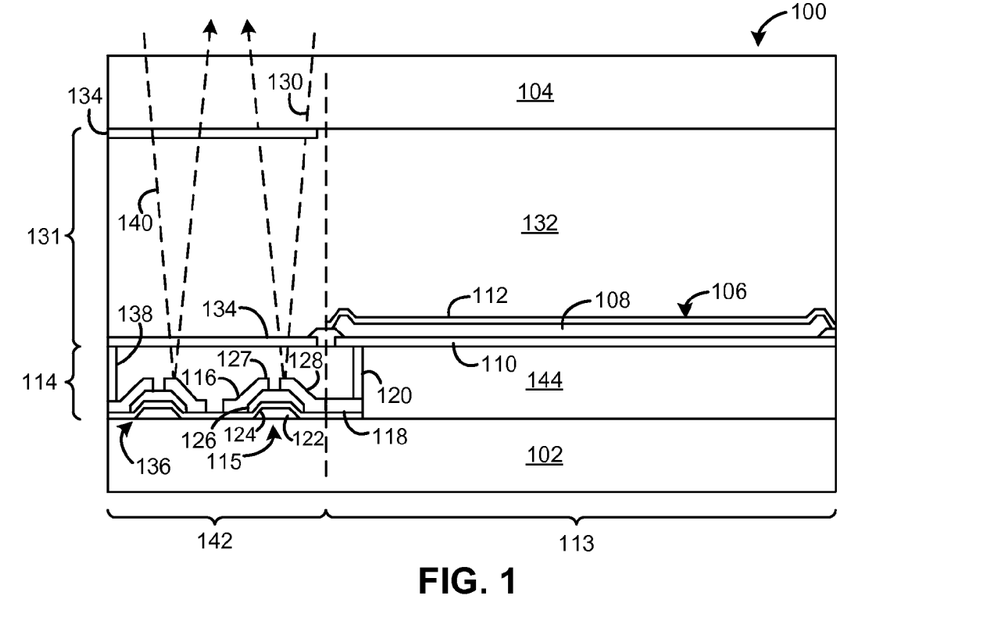
FIG. 1 is a schematic, cross-sectional view of a transflective display sub-pixel with an organic light emitting diode (OLED) transmissive section and a reflective section in accordance with one example.

FIG. 1 is a cross-sectional view of a portion of a display 100 configured for both transmissive and reflective illumination. The display 100 may be a component of a variety of different electronic devices. The example of FIG. 1 schematically depicts a single sub-pixel of the display 100. Multiple instances of the sub-pixel may be provided for each pixel of the display 100. In some cases, red, green, and blue sub-pixels are provided in each pixel. The pixels are then arranged in an array across the viewable area of the display 100. Additional, fewer, or alternative sub-pixels may be provided in each pixel. For example, the display 100 may be composed of pixels that do not have sub-pixels.

In the example of FIG. 1, the display 100 includes a substrate 102 and a substrate 104 spaced from the substrate 102. During operation, light generated by the display 100 passes through the substrate 104. The substrate 102 may be considered a substrate despite being disposed along a front or upper face of the display 100 because one or more layers or elements of the display 100 may be deposited or otherwise formed thereon during assembly. For example, color filter and/or touch sensor layers may be applied to or formed on the substrate 104. The substrate 104 may be configured as a cover (e.g., cover glass) with or without any applied layers. In some cases, both of the substrates 102, 104 are composed of glass and/or other transparent materials.

The display 100 includes an organic light emitting diode (OLED) structure 106 supported by the substrate 102. The OLED structure 106 may include a stack 108 of organic layers disposed between an anode layer 110 and a cathode layer 112. In this example, the cathode layer 112 is a transparent layer to allow light emitted by the OLED structure 106 to be transmitted through the substrate 104. For example, the cathode layer 112 may be composed of indium tin oxide (ITO) and/or other transparent materials. Voltages applied to the anode and cathode layers 110, 112 cause the stack 108 of the organic layers to emit light. In one example, the light emitted by the OLED structure 106 may be green, red, or blue. In other cases, white light is emitted. The OLED structure 106 may extend laterally across the display sub-pixel and thereby define a transmissive area 113 of the sub-pixel. The composition, construction, configuration, and other characteristics of the OLED structure 106 and the transmissive area may vary from the example shown.

The display 100 also includes a plurality of thin film structures 114 supported by the substrate 102. The thin film structures 114 include a number of drive circuit elements and a number of reflective elements. The drive circuit elements are arranged in drive circuitry 115 supported by the substrate 102 and electrically coupled to the OLED structure 106. The drive circuitry 115 is configured to control the OLED structure 106. The drive circuitry 115 may include one or more transistors 116 configured to control the OLED structure 106. In the example of FIG. 1, the drive circuitry 115 includes one or more interconnects 118, and a via 120 to couple a transistor 116 to the anode layer 110 of the OLED structure 106. Further interconnects and/or other conductive elements may be provided to establish an electrical connection between the drive circuitry 115 and the cathode layer 112. Such other conductive elements may be outside of the plane of the cross-sectional view of FIG. 1. The cathode layer 112 may be electrically connected to ground or another voltage reference via any other node of the drive circuitry 115. The manner in which the drive circuitry 115 is coupled to the OLED structure 106 may vary from the example shown. For instance, the via 120 may directly connect the transistor 116 to the anode layer 110.

Each transistor 116 may include or be configured as a combination of a subset of the thin-film transistor (TFT) structures 114. In the example of FIG. 1, the transistor 116 includes the following elements or components: a gate 122; a gate dielectric layer 124 disposed over the gate 122; a body region 126 spaced from the gate 122 by the gate dielectric layer 124; and source and drain terminals or electrodes 127, 128 spaced apart from one another such that a channel is established in the body region 124 during operation; and, source and drain terminals or electrodes 127, 128 contiguous with or otherwise adjacent the body region 124. The components of the transistor 116 may be arranged in a staggered, bottom-gate configuration in which the gate 122 is disposed on and in contact with the substrate 102 as shown.

The gate 122 may be composed of polysilicon, metal, and/or other conductive materials. One or more insulator or dielectric materials may be used for the gate dielectric layer 124, and may vary in accordance with the material(s) used for the gate 122 and/or the body region 126. The body region 126 may be composed of various types of semiconductor materials, including both inorganic and/or organic semiconductor materials.

In the example of FIG. 1, the drain terminal 128 is electrically connected to the interconnect 118 to drive, or establish the voltage applied to, the anode layer 110. Other circuit arrangements may be used. For example, the transistor 116 may establish the voltage applied to the cathode layer 112. Alternatively or additionally, the source terminal 128 may be electrically connected to the OLED structure 106.

In the example of FIG. 1, the drive circuitry 115 includes or is configured with one or more reflective circuit elements. Each reflective circuit element is positioned to reflect ambient light 130 passing through the substrate 104. Several circuit elements may be reflective in the example of FIG. 1. Any one or more of the electrodes, terminals, or other elements of the transistor 116 may be reflective. For example, the source and drain terminals 127, 128 may be composed of one or more metals or other conductive materials capable of reflecting the ambient light 130. In FIG. 1, the ambient light 130 is depicted as reflecting off of the drain terminal 128. Alternatively or additionally, the interconnect 118 and/or other elements of the drive circuitry 115 may be the reflective circuit element. Alternatively or additionally, the semiconductor material(s) of the body region 126 may be reflective. In still other cases (e.g., having alternative transistor configurations), the conductive material(s) of the gate 122 may be reflective. Any combination of these and other circuit elements of the drive circuitry 115 may be relied upon to reflect the ambient light 130.

The reflection of the ambient light 130 may be used during a reflective mode of operation. When the display 100 is used in bright ambient light conditions (e.g., outside use), the light generated by the OLED structure 106 may be insufficient and/or too resource intensive. The reflective mode of operation may provide an alternative or additional source of light for the display 100. The reflective mode of operation may or may not involve deactivating the OLED structure 106. Thus, in some cases, the light generated by the OLED structure 106 may be supplemented during the reflective mode of operation through the reflection of the ambient light 130. In other (e.g., dark or darker) conditions, the display 100 may be operated in a transmissive mode in which only the light generated by the OLED structure 106 is used.

The use of the transistor electrodes 127, 128, other transistor components, or other drive circuitry elements to reflect the ambient light 130 may avoid the addition of layers or other structures solely for purposes of reflection. Such layers or structures may undesirably add to the thickness or size of the display 100. The layers or structures may also add to fabrication costs through additional masks and/or other fabrication process steps. The addition of other layers or structures may also create undesirable capacitive effects in the drive circuitry 115 if conductive materials are used. The use of the drive circuitry elements may also allow the same conductive material, if not the same conductive layer, to be used as an electrode on both the transmissive and reflective sides. Notwithstanding the foregoing, the plurality of thin film structures 114 may include additional or alternative reflective elements, an example of which is described and shown in connection with FIG. 4.

The display 100 includes an optical switch stack 131 disposed between the substrate 104 and the plurality of thin film structures 114. The optical switch stack 131 includes an intensity control layer 132 disposed between the substrates 102, 104 to control the extent to which the ambient light 130 is reflected and/or used by the display 100. In some cases, the intensity control layer 132 is or includes a liquid crystal layer. The optical switch stack 131 may thus include or be configured as a liquid crystal stack or assembly. The liquid crystal layer 132 is positioned relative to the drive circuitry 115 such that the ambient light 130 reflecting off of the reflective circuit element passes through the liquid crystal layer 132.

The liquid crystal layer 132 controls the extent to which the ambient light is used by the display 100. The intensity of the reflected light is controlled through the application of a control voltage between electrodes 134 of the optical switch stack 131. The electrodes 134 may be transparent layers that extend laterally along respective sides of the liquid crystal layer 132. In this example, one of the electrodes 134 is disposed at (e.g., adjacent to) the substrate 104, with the understanding that other layers of the optical switch stack 131, such as a polarizer layer, may be disposed between the electrode 134 and the substrate 104. Other materials having a transmissivity adjustable via an applied voltage may be used for the intensity control layer 132.

The display 100 may include further drive circuitry 136 configured to control the optical switch stack 131. The drive circuitry 136 may be formed in the plurality of thin film structures 114 or otherwise supported by the substrate 102. In some cases, the drive circuitry 136 includes one or more thin film transistors configured or constructed in a manner similar to the OLED drive circuitry 115. For example, the transistors of the drive circuits 115, 136 may have a common staggered, bottom-gate configuration. In the example of FIG. 1, the drive circuitry 136 includes a transistor electrode (e.g., a drain terminal) electrically connected to one of the electrodes 134 for the liquid crystal layer 132. To that end, the drive circuitry 136 may include a via 138. The other electrode 134 may be connected to ground or another voltage reference. The via 138 and/or other vias described herein may include or be configured as a solder or other bump or structure that forms a conductive connection during assembly of the display 100.

One or more circuit elements of the drive circuitry 136 may also be reflective. The reflectivity may be established through use of the same materials to form the elements of the drive circuits 115, 136. In the example of FIG. 1, ambient light 140 is shown reflecting off of a transistor electrode of the drive circuitry 136. The drive circuitry 136 is positioned such that the reflected ambient light 140 passes through the liquid crystal layer 132 before exiting the display 100.

The display 100 may be operated in multiple modes. In a dual mode example, the operational modes include a transmissive mode and a reflective mode. The OLED drive circuitry 115 is activated in the transmissive mode and deactivated in the reflective mode. The drive circuitry 136 for the liquid crystal layer 132 may then be activated in the reflective mode and deactivated in the transmissive mode. Alternatively or additionally, the drive circuitry 136 may reside in a state in the transmissive mode such that the liquid crystal layer 132 is transparent or substantially transparent. Additional operational modes may be provided. For example, a transflective mode of operation may involve activation of both drive circuits 115, 136, in which case the reflected ambient light supplements the illumination provided by the OLED structure 106.

One or both of the drive circuits 115, 136 may be disposed in a sub-pixel transistor area 142. In the example of FIG. 1, both of the drive circuits 115, 136 and the sub-pixel transistor area 142 are disposed outside of the sub-pixel transmissive area 113. The drive circuitry 115 may be laterally offset from the sub-pixel transmissive area 113 to allow the reflection of the ambient light 130. In some cases, there is no overlap between the drive circuitry 115 and the transmissive area 113. In other cases, the areas 113, 142 overlap to a partial extent. For example, one or more interconnects of the drive circuitry 115 may be disposed in the sub-pixel transmissive area 113.

Some of the elements of the display 100 may extend across both of the sub-pixel areas 113, 142. For example, in some cases, the liquid crystal layer 132 extends across both areas 113, 142. In such cases, the liquid crystal layer 132 may fill the space between the OLED structure 106 and the substrate 104. The liquid crystal layer 132 may be inactive in the sub-pixel transmissive area 113. For example, the electrodes 134 may not extend into the sub-pixel transmissive area 113. In other cases, the electrodes 134 (and/or other electrodes) extend across the sub-pixel transmissive area 113 such that the liquid crystal layer 134 may be used to control the extent to which the OLED structure 106 provides light. Such control may, for example, allow the display 100 to supplement the reflected light with the light generated by the OLED structure 106.

The display 100 (or the optical switch stack 114 thereof) may include a color filter positioned relative to the drive circuitry 115 such that the reflected ambient light 130 passes through the color filter. The color filter may be configured to establish the sub-pixel as a red, green, or blue sub-pixel. The reflected ambient light 130 may thus take on the desired color when allowed to pass back through the substrate 104. In the example of FIG. 1, the color filter is integrated with the liquid crystal layer 132. For instance, the color filter may be provided as a dye and/or a dopant mixed or otherwise incorporated into the liquid crystal material of the layer 132.

In some cases, the color filter dye or dopant extends across both of the areas 113, 142, in which case the output of the OLED structure 106 may be adjusted to compensate for the effects of the color filter. In other cases, the color filter dye or dopant is limited to the sub-pixel transistor area 142. The color filter may be disposed within the sub-pixel transistor area 142 but not within the sub-pixel transmissive area 113 through selective doping (e.g., photolithography) or other patterning techniques. Alternatively, the sub-pixel transistor area 113 and the sub-pixel transmissive area 142 may be separated by a wall, such as a glue wall (e.g., a glue wall cured via ultraviolet light).

The display 100 may include a number of other layers directed to integration and/or implementation of the drive circuits 115, 136, the OLED structure 106, and/or other components of the display 100. For example, the display 100 may include a number of planarization and/or spacer layers. In some cases, planarization and/or spacing is provided by one or more dielectric layers. In the example of FIG. 1, the display 100 includes a planarization layer 144 to provide a level surface for the formation of the OLED structure 106 and the electrode 134 of the liquid crystal layer 132. The planarization layer 144 may be composed of a dielectric material, such as silicon nitride, but additional or alternative materials may be used. Additional and/or alternative planarization may be provided by one or more optical adhesive layers, which may be used to assemble the display 100 after respective formation of components on the substrates 102, 104. For example, the OLED structure 106 and the thin film structures 114 may be formed on the substrate 102, and the optical switch stack 131 formed on the substrate 104. An adhesive layer (not shown) may then be used to assemble the display 100. Additional, alternative or fewer layers (e.g., dielectric layers) may be used to separate or otherwise define the drive circuits 115, 136, the OLED structure 106, and/or other display components. For example, an additional dielectric layer may be disposed upon the OLED structure 106, e.g., for planarization and/or passivation thereof.

The transistor(s) 116 of the drive circuitry 115 (and/or the transistor(s) of the drive circuitry 136) may include additional or alternative components. In some cases, the body region 126 is doped to form source and drain regions. The source and drain regions may be used to establish Ohmic contacts with the body region 126 for the source and drain terminals 126, 128. Alternatively, one or more semiconductor layers may be deposited on the body region 126 to form the source and drain regions. In either case, the semiconductor material(s) used to form the source and drain regions may also be configured and positioned to reflect the ambient light 130.

Alternative or additional transistor configurations may be used, including, for instance, coplanar bottom-gate configurations, and coplanar and staggered top-gate configurations, and still other field-effect transistor configurations. The transistor configuration may vary in other ways as well. For example, the gate 122 may be formed or disposed within a hole etched in the substrate 102.

Figure 2:
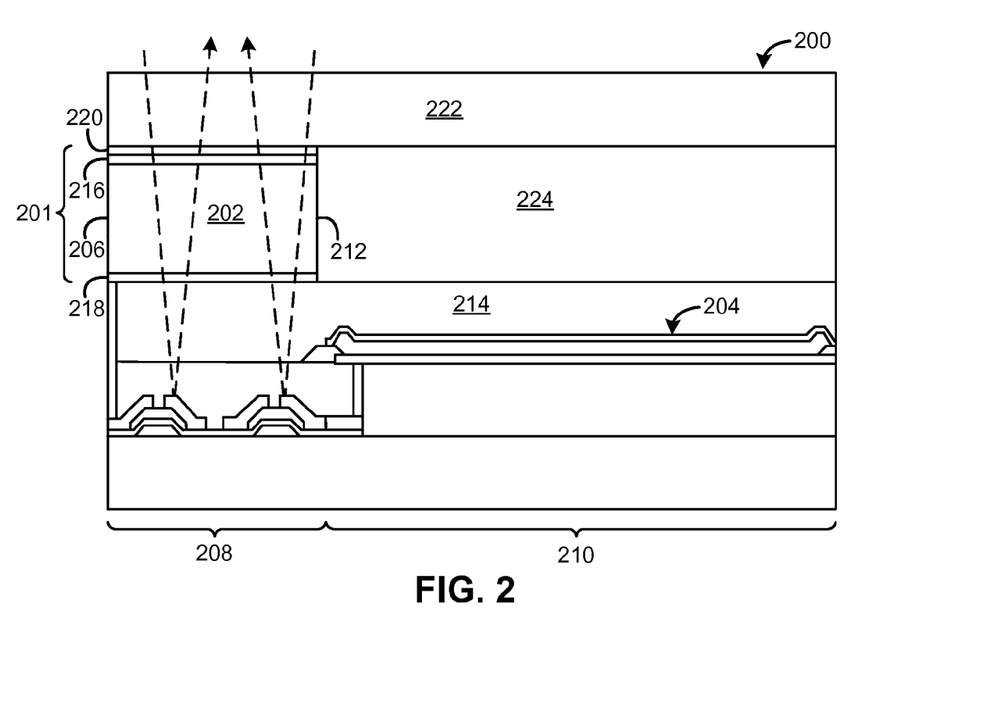
FIG. 2 is a schematic, cross-sectional view of a transflective display sub-pixel with an OLED transmissive section and a reflective section having a liquid crystal repository in accordance with one example.

FIG. 2 depicts an example of a display 200 having an optical switch stack 201. In this example, the optical switch stack 201 includes a liquid crystal layer 202. A number of components of the display 200, including, for instance, an OLED structure 204, may be configured as described above in connection with FIG. 1. In contrast to the examples described above in connection with FIG. 1, the liquid crystal layer 202 and other components of the optical switch stack 201 do not extend across an OLED structure 204.

In the example of FIG. 2, the liquid crystal layer 202 is disposed within a container 206. The container 206 may be considered a component of the optical switch stack 201. The container 206 may have one or more sidewalls disposed along a boundary between a sub-pixel drive circuit (e.g., transistor) area 208 and a sub-pixel transmissive area 210. For example, an inner wall or barrier 212 of the container 206 may be disposed at or near an end of the OLED structure 204. The container may thus not extend laterally beyond the drive circuit area 208. The lateral extent of the liquid crystal layer 202 may be otherwise limited or defined as desired.

The container 206 may also limit the vertical extent of the optical switch stack 201 and, thus, the liquid crystal layer 202. The container 206 may thus also include or define top and bottom barriers. Alternatively, other layers of the display 200 act as vertical barriers for the optical switch stack 201.

The container 206 may be formed via UV-curable glue and/or other materials. A variety of different materials and repository constructions and configurations may be used for the container 206.

A bottom of the optical switch stack 201 (e.g., the container 206) may be established by, or be in contact with, a spacer layer or structure 214. The spacer layer 214 may be used for planarization of the drive circuit area 208 (e.g., above one or more thin film transistors). In this example, the spacer layer 214 extends across both the transistor area 208 and the transmissive area 210. The spacer layer 214 may be configured as an optical adhesive layer for display assembly. In other cases, the spacer layer 214 does not extend across the transmissive area 210, in which case the spacer layer 214 may act as a planarization layer for only the transistor area 208. The composition of the spacer layer 224 may be similar or identical to the planarization layers described hereinabove.

Electrodes 216, 218 of the optical switch stack 201 are disposed along top and bottom surfaces of the liquid crystal layer 202. Each electrode 216, 218 may be configured as described above. For instance, the electrodes 216, 218 may be composed of ITO and/or other transparent materials. In some cases, the electrodes 216, 218 are disposed within the container 206.

In the example of FIG. 2, color filtering is not integrated with the liquid crystal layer 202. A layer 220 of the optical switch stack 201 is configured to act as a color filter for the sub-pixel drive circuit area 208. The layer 220 is positioned relative to the drive circuitry such that the reflected ambient light passes through the layer 220 for purposes of color filtering. In this case, the color filter layer 220 does not extend laterally beyond the sub-pixel drive circuit area 208. The color filter layer 220 may be secured or applied to, or otherwise formed upon, a front substrate 222. The lateral extent of the color filter layer 220 may be established or limited by the container 206 in, for example, cases in which the container 206 is also formed on the front substrate 222.

The drive circuit and transmissive areas 208, 210 may otherwise be configured similarly to the examples described above in connection with FIG. 1. For instance, one or more drive circuits having a number of reflective elements (e.g., transistor electrodes) may be disposed in the drive circuit area 208. The OLED structure 204 is laterally offset from the drive circuits in the transmissive area 210 above a planarization layer.

Another spacer layer or structure 224 may be disposed between the OLED structure 204 and the front substrate 222. In the example of FIG. 2, the spacer layer 224 is disposed between the planarization (or adhesive) layer 214 and the front substrate 222. The composition of the spacer layer 224 may be similar or identical to the planarization layers described hereinabove.

Figure 3:
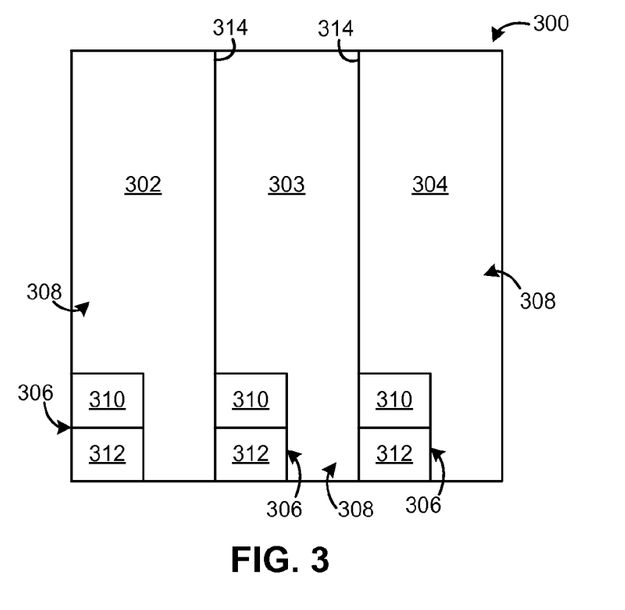
FIG. 3 is a schematic, plan view of a pixel of a display having transflective sub-pixels in accordance with one example.

FIG. 3 depicts a pixel 300 in accordance with one example of a transflective display. The pixel 300 includes a red sub-pixel 302, a green sub-pixel 303, and a blue sub-pixel 304. Each of the sub-pixels 302-304 may be configured as described herein. For instance, each sub-pixel 302-304 may include a transistor or drive circuit area 306 in which one or more reflective elements (e.g., reflective circuit elements) are disposed and a transmissive area 308 in which an OLED structure is disposed. As described above, the optical switch stack (e.g., the liquid crystal and color filter) of each sub-pixel 302-304 may be either confined to only the drive circuit area 306, or extend across the transmissive area 308 as well.

The arrangement of the sub-pixels 302-304 may differ from the example shown. For example, the relative sizes and/or positions of the sub-pixels 302-304 may vary. Alternatively or additionally, the relative sizes and/or positions of the drive circuit areas 306 and the transmissive areas 308 may vary from the example shown. In some cases, the relative sizes of the drive circuit areas 306 and the transmissive areas 308 vary between the sub-pixels 302-304. Differences in the relative sizes of the areas 306, 308 may be warranted given the extent to which the ambient light contains the respective color. Additional and/or alternative factors may be considered for determining the relative sizes of the areas 306, 308, including, for instance, the capacity of the OLED structure to generate the respective color.

In the example of FIG. 3, each drive circuit area 306 includes OLED drive circuitry 310 and drive circuitry 312 for an optical switch stack, such as a liquid crystal stack. The drive circuitry 310, 312 may be integrated to any desired extent. For example, in other cases, one or more transistors are used to control both the liquid crystal stack and the OLED structure of a respective one of the sub-pixels 302-304. The positioning of the drive circuitry 310, 312 relative to the transmissive area 308 may vary greatly from the example shown. For example, the drive circuitry 310, 312 may not be disposed in a corner as shown.

Adjacent pairs of the sub-pixels 302-304 may be separated from one another by a respective wall 314. In some cases, each wall 314 is formed from a UV curable glue. Other materials may be used. Similar walls may be used to separate adjacent pixels from one another.

Figure 4:
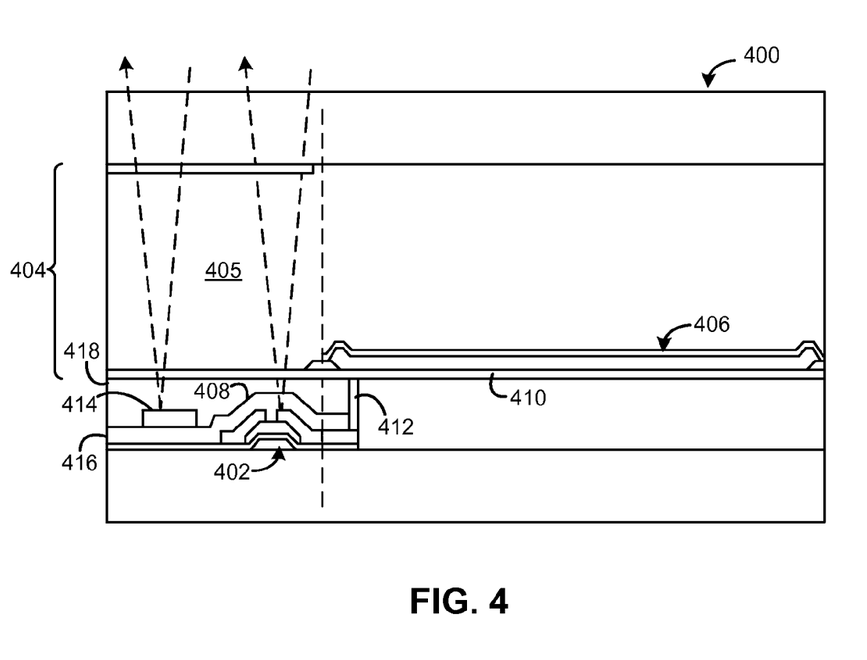
FIG. 4 is a schematic, cross-sectional view of a transflective display sub-pixel with an OLED transmissive section and a reflective section having a reflective electrode and a common drive circuit electrode in accordance with one example.

FIG. 4 depicts an exemplary display 400 in which drive circuitry 402 is configured to control both an optical switch stack 404 having, in this case, a liquid crystal layer 405, and an OLED structure 406. The liquid crystal layer 405, other components of the optical switch stack 404, and the OLED structure 406 may be configured as described above. In this example, the drive circuitry 402 differs from the other examples in connection with one or more transistors 408 of the drive circuitry 402. In this case, the transistor 408 is configured to control both the optical switch stack 404 and the OLED structure 406. To that end, the transistor 408 is electrically coupled to both the optical switch stack 404 and the OLED structure 406.

The transistor 408 may be constructed and otherwise configured as described hereinabove. For instance, as described above, the transistor 408 may be configured as a thin-film transistor that includes one or more reflective elements or components for ambient light reflection.

In the example of FIG. 4, the liquid crystal layer 404 and the OLED structure 406 share a common electrode 410. The electrode 410 may be transparent. The transistor 408 is coupled to the common electrode 410. In this case, a via 412 connects the common electrode 410 to an electrode or terminal (e.g., a drain terminal) of the transistor 408. The transistor 408 may thus activate the sub-pixel shown through selective application of a voltage to the common electrode 410. One or more other transistors (e.g., outside of the plane of the cross-sectional view of FIG. 4) may then be used to determine the operational mode of the display 400. Transmissive, reflective, and/or transflective operational modes may be supported.

FIG. 4 also shows an example of an embodiment in which one or more additional reflective structures or elements 414 are fabricated in connection with the drive circuitry 402. Each reflective element 414 may thus be one of the thin film structures fabricated during the process of forming the drive circuitry 402. However, the reflective element 414 may or may not have a circuit function. For instance, in the example of FIG. 4, the reflective element 414 may be configured as an electrically floating metal structure. The reflective element 414 may be formed in a metal layer dedicated to establishing reflective structures. The reflective element(s) 414 may alternatively or additionally formed in a metal layer used to form interconnects, electrodes, or other elements of the drive circuitry 402, but nonetheless be disconnected from the drive circuitry 402. In still other cases, the reflective element 414 may be connected to an interconnect or other functional circuit element, but still not provide a circuit function. For example, the reflective element 414 may be configured as a superfluous tab that expands the area covered by an interconnect or other circuit element.

The thin film structures of the display 400 may include a number of passivation layers and/or planarization layers to support the reflective structure 414. In the example of FIG. 4, the reflective element 414 is formed upon a passivation layer 416 that covers the transistor 408. The passivation layer 416 may include, for instance, silicon nitride and/or another dielectric material. The reflective element 414 may be formed during a metal layer deposition process implemented after deposition of the passivation layer 416. After deposition, etching, and/or other processes used to form the reflective element 414, another passivation layer 418 may be deposited. In this case, the passivation layer 418 is configured as a planarization layer disposed between the reflective element 414 and the optical switch stack 404. The passivation layer 418 may include or be configured as an optical adhesive layer.

Figure 5:
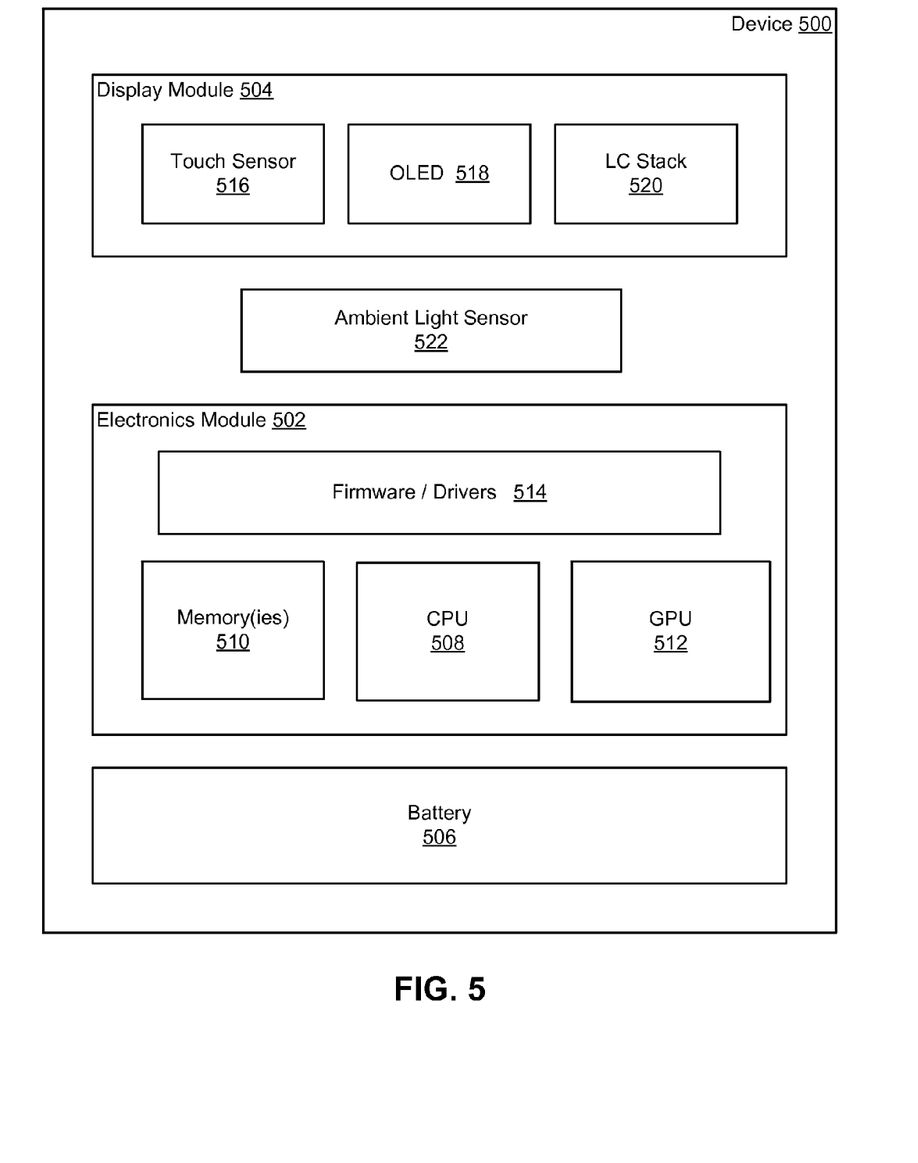
FIG. 5 is a block diagram of an electronic device in which a transflective display may be used in accordance with one example.

FIG. 5 shows an exemplary electronic device 500 into which the above-described transflective OLED displays may be incorporated. The device 500 includes an electronics module 502 and a display module 504 (or subsystem), and a battery 506. The electronic device 500 may include additional, fewer, or alternative components. For example, the display module 504 may be integrated with the electronics module 502 and/or other components of the electronic device 500 to a varying extent. For instance, the electronics module 502 and/or the display module 504 may include a graphics subsystem of the electronic device 500. Any number of display modules or systems may be included. In this example, the device 500 includes a processor 508 and one or more memories 510 separate from the display module 504. The processor 508 and the memories 510 may be directed to executing one or more applications implemented by the device 500. The display module 504 generates a user interface for an operating environment (e.g., an application environment) supported by the processor 508 and the memories 510. The processor 508 may be a general-purpose processor, such as a central processing unit (CPU), or any other processor or processing unit. Any number of such processors or processing units may be included.

In the example of FIG. 5, the electronics module 502 includes a graphics processing unit (GPU) 512 and firmware and/or drivers 514. The GPU 512 may be dedicated to graphics- or display-related functionality and/or provide general processing functionality. Some of the components of the electronics module 502 may be integrated. For example, the processor 508, the one or more of the memories 510, the GPU 512, and/or the firmware 514 may be integrated as a system-on-a-chip (SoC) or application-specific integrated circuit (ASIC). The electronics module 502 may include additional, fewer, or alternative components. For example, the electronics module 502 may not include a dedicated graphics processor, and instead rely on the CPU 508 or other general-purpose processor to support the graphics-related functionality of the electronic device 500. The electronics module 502 may include additional memory (or memories) to support display-related processing.

In the example of FIG. 5, the display module 504 includes a touch sensor unit 516, an OLED unit 518, and a liquid crystal (LC) stack 520. The OLED unit 518 and the liquid crystal stack 520 may be configured in accordance with one of the examples described above. Additional, fewer, or alternative display components may be provided. For example, in some cases, the display module 504 does not include the touch sensor unit 516.

The device 500 further includes an ambient light sensor 522. The ambient light sensor 522 provides a signal indicative of the ambient light level to the processor 508, the GPU 512, and/or the firmware 514. The ambient light level may then be used by the processor 508, the GPU 512, and/or the firmware 514 to determine the operational mode of the display module 504. For instance, a transmissive operational mode in which the OLED unit 518 is used may be implemented during low ambient light conditions. A reflective operational mode in which the OLED unit 518 is not used and the liquid crystal layer 520 is used may be implemented during bright ambient light conditions. Alternatively, a transflective operational mode in which both the OLED unit 518 and the liquid crystal layer 520 are used may be implemented during bright ambient light conditions.

The device 500 may be configured as one of a wide variety of computing devices, including, but not limited to, handheld or wearable computing devices (e.g., tablets and watches), communication devices (e.g., phones), laptop or other mobile computers, personal computers (PCs), and other devices. The device 500 may also be configured as an electronic display device, such as a computer monitor, a television, or other display or visual output device.

In one aspect, a display includes first and second substrates spaced apart from one another, an OLED structure supported by the first substrate, and a plurality of thin film structures supported by the first substrate. The plurality of thin film structures include a drive circuit element and a reflective element. The drive circuit element is arranged in drive circuitry electrically coupled to the OLED structure. The drive circuitry is configured to control the OLED structure. The display further includes an optical switch stack disposed between the second substrate and the plurality of thin film structures. The optical switch stack includes a color filter positioned relative to the reflective element such that ambient light reflecting off of the reflective circuit element passes through the color filter.

In another aspect, a display includes a substrate, an OLED structure supported by the substrate, drive circuitry supported by the substrate, and a color filter. The drive circuitry is electrically coupled to the OLED structure. The drive circuitry is configured to control the OLED structure. The drive circuitry includes a reflective circuit element. The color filter is positioned relative to the drive circuitry such that ambient light reflecting off of the reflective circuit element passes through the color filter.

In yet another aspect, a display includes first and second substrates spaced apart from one another and an OLED structure supported by the first substrate. The OLED structure extends across and defines a sub-pixel transmissive area. The display further includes a plurality of thin film structures supported by the first substrate. The plurality of thin film structures include a drive circuit element and a reflective element. The drive circuit element is arranged in drive circuitry electrically coupled to the OLED structure. The drive circuitry is configured to control the OLED structure. The reflective element is disposed in a sub-pixel transistor area outside of the sub-pixel transmissive area. The display further includes an optical switch stack disposed between the second substrate and the plurality of thin film structures. The optical switch stack includes a color filter disposed within the sub-pixel transistor area and not within the sub-pixel transmissive area. The color filter is positioned relative to the reflective element such that ambient light reflecting off of the reflective element passes through the color filter.

In still yet another aspect, a display includes a substrate, an OLED structure supported by the substrate, and transistor drive circuitry supported by the substrate. The transistor drive circuitry is electrically coupled to the OLED structure. The transistor drive circuitry is configured to control the OLED structure. The transistor drive circuitry includes a reflective transistor electrode. The display further includes a color filter positioned relative to the drive circuitry such that ambient light reflecting off of the reflective transistor electrode passes through the color filter.

In connection with any one of the aforementioned aspects, the electronic device may alternatively or additionally include any combination of one or more of the following aspects or features. The reflective element is configured as an element of the drive circuitry. The reflective element includes an electrically floating metal structure. The drive circuit element is reflective and positioned relative to the color filter for reflection of further ambient light through the color filter. The plurality of thin film structures include a passivation layer disposed between the reflective element and the optical switch stack. The plurality of thin film structures include a planarization layer disposed between the reflective element and the optical switch stack. The optical switch stack includes a liquid crystal stack. The liquid crystal stack includes first and second electrode layers and a liquid crystal layer disposed between the first and second electrode layers. The color filter is integrated with the liquid crystal layer. The color filter includes a film secured to the second substrate. The color filter is secured to the second substrate. A liquid crystal layer is disposed between the first and second substrates. The liquid crystal layer is positioned relative to the drive circuitry such that the ambient light reflecting off of the reflective circuit element passes through the liquid crystal layer. The drive circuitry is first drive circuitry. The display further includes second drive circuitry supported by the first substrate. The second drive circuitry is configured to control the liquid crystal layer. The first drive circuitry is activated in a transmissive mode and deactivated in a reflective mode. The second drive circuitry is activated in the reflective mode and deactivated in the transmissive mode. The drive circuitry is configured to control the OLED structure and the liquid crystal layer. The liquid crystal layer does not extend across the OLED structure. The display further includes a container in which the liquid crystal layer is disposed, the container not extending laterally beyond a sub-pixel transistor area. The color filter does not extend laterally beyond the sub-pixel transistor area. The display further includes a spacer disposed between the container and the drive circuitry in the sub-pixel transistor area. The reflective element is configured as an element of the drive circuitry. The optical switch stack includes a liquid crystal stack, the liquid crystal stack including first and second electrode layers and a liquid crystal layer disposed between the first and second electrode layers. The drive circuitry is configured to control the OLED structure and the liquid crystal layer.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A display comprising:
   first and second substrates spaced apart from one another;
   an organic light emitting diode (OLED) structure supported by the first substrate;
   a plurality of thin film structures supported by the first substrate, the plurality of thin film structures comprising a reflective drive circuit element, the reflective drive circuit element arranged in drive circuitry electrically coupled to the OLED structure, the drive circuitry configured to control the OLED structure; and
   an optical switch stack disposed between the second substrate and the plurality of thin film structures, the optical switch stack comprising a color filter positioned relative to the reflective drive circuit element such that ambient light reflecting off of the reflective drive circuit element passes through the color filter;
wherein the reflective drive circuit element is disposed in a transistor area; and
wherein the transistor area is outside of a transmissive area in which the OLED structure is disposed.

2. The display of claim 1, wherein the reflective drive circuit element comprises a transistor element.

3. The display of claim 1, wherein the reflective drive circuit element comprises a body region of a transistor.

4. The display of claim 1, wherein the reflective drive circuit element comprises an interconnect.

5. The display of claim 1, wherein the plurality of thin film structures comprise a passivation layer disposed between the reflective element and the optical switch stack.

6. The display of claim 1, wherein the plurality of thin film structures comprise a planarization layer disposed between the reflective element and the optical switch stack.

7. The display of claim 1, wherein the optical switch stack comprises a liquid crystal stack, the liquid crystal stack comprising first and second electrode layers and a liquid crystal layer disposed between the first and second electrode layers.

8. The display of claim 7, wherein the color filter is integrated with the liquid crystal layer as a dopant.

9. The display of claim 1, wherein the color filter comprises a film secured to the second substrate.

10. A display comprising:
a substrate;
an organic light emitting diode (OLED) structure supported by the substrate;
drive circuitry supported by the substrate, the drive circuitry electrically coupled to the OLED structure, the drive circuitry configured to control the OLED structure, the drive circuitry comprising a reflective circuit element; and
a color filter positioned relative to the drive circuitry such that ambient light reflecting off of the reflective circuit element passes through the color filter;
wherein the reflective circuit element is disposed in a transistor area; and
wherein the transistor area is outside of a transmissive area in which the OLED structure is disposed.

11. The display of claim 10, wherein:
the substrate is a first substrate;
the display further comprises a second substrate spaced from the first substrate; and
the color filter is secured to the second substrate.

12. The display of claim 10, wherein:
the substrate is a first substrate;
the display further comprises:
a second substrate spaced from the first substrate; and
a liquid crystal layer disposed between the first and second substrates; and
the liquid crystal layer is positioned relative to the drive circuitry such that the ambient light reflecting off of the reflective circuit element passes through the liquid crystal layer.

13. The display of claim 12, wherein:
the drive circuitry is first drive circuitry;
the display further comprises second drive circuitry supported by the first substrate; and
the second drive circuitry is configured to control the liquid crystal layer.

14. The display of claim 13, wherein:
the first drive circuitry is activated in a transmissive mode and deactivated in a reflective mode; and
the second drive circuitry is activated in the reflective mode and deactivated in the transmissive mode.

15. The display of claim 12, wherein the drive circuitry is configured to control the OLED structure and the liquid crystal layer.

16. The display of claim 12, wherein the liquid crystal layer does not extend across the OLED structure.

17. The display of claim 12, further comprising a container in which the liquid crystal layer is disposed, the container not extending laterally beyond a sub-pixel transistor area.

18. The display of claim 17, wherein the color filter does not extend laterally beyond the sub-pixel transistor area.

19. The display of claim 17, further comprising a spacer disposed between the container and the drive circuitry in the sub-pixel transistor area.

20. A display comprising:
first and second substrates spaced apart from one another;
an organic light emitting diode (OLED) structure supported by the first substrate, the OLED structure extending across and defining a sub-pixel transmissive area;
a plurality of thin film structures supported by the first substrate, the plurality of thin film structures comprising a drive circuit element and a reflective element, the drive circuit element arranged in drive circuitry electrically coupled to the OLED structure, the drive circuitry configured to control the OLED structure, the reflective element disposed in a sub-pixel transistor area outside of the sub-pixel transmissive area; and
an optical switch stack disposed between the second substrate and the plurality of thin film structures, the optical switch stack comprising a color filter disposed within the sub-pixel transistor area and not within the sub-pixel transmissive area, the color filter positioned relative to the reflective element such that ambient light reflecting off of the reflective element passes through the color filter.

21. The display of claim 20, wherein the reflective element is configured as an element of the drive circuitry.

22. The display of claim 20, wherein the optical switch stack comprises a liquid crystal stack, the liquid crystal stack comprising first and second electrode layers and a liquid crystal layer disposed between the first and second electrode layers.

23. The display of claim 22, wherein the drive circuitry is configured to control the OLED structure and the liquid crystal layer.

* * * * *